(12) United States Patent
Parker et al.

(10) Patent No.: US 7,504,655 B2
(45) Date of Patent: Mar. 17, 2009

(54) MULTILAYER STRUCTURES AS STABLE HOLE-INJECTING ELECTRODES FOR USE IN HIGH EFFICIENCY ORGANIC ELECTRONIC DEVICES

(75) Inventors: Ian D. Parker, Santa Barbara, CA (US); Chi Zhang, Goleta, CA (US)

(73) Assignee: E. I. Du Pont De Nemours & Company, Wilmington, DE (US)

( * ) Notice: Subject to any disclaimer, the term of this patent is extended or adjusted under 35 U.S.C. 154(b) by 0 days.

(21) Appl. No.: 11/116,500

(22) Filed: Apr. 28, 2005

(65) Prior Publication Data

US 2005/0184306 A1    Aug. 25, 2005

Related U.S. Application Data

(63) Continuation of application No. 10/324,317, filed on Dec. 20, 2002, now abandoned, which is a continuation of application No. 09/881,223, filed on Jun. 14, 2001, now abandoned.

(60) Provisional application No. 60/212,924, filed on Jun. 20, 2000.

(51) Int. Cl.
*H01L 33/00* (2006.01)
(52) U.S. Cl. .............. 257/40; 257/88; 257/103; 257/E25.008; 257/E51.004; 257/E51.012
(58) Field of Classification Search ................ 257/40, 257/88, 103, 72
See application file for complete search history.

(56) References Cited

U.S. PATENT DOCUMENTS

| | | | |
|---|---|---|---|
| 4,720,432 A | 1/1988 | VanSlyke et al. | |
| 5,247,190 A | 9/1993 | Friend et al. | |
| 5,254,633 A | 10/1993 | Han et al. | |
| 5,399,936 A | 3/1995 | Namiki et al. | |
| 5,408,109 A | 4/1995 | Heeger et al. | |
| 5,698,740 A | 12/1997 | Enokida et al. | |
| 5,719,467 A | 2/1998 | Antoniadis et al. | |
| 5,723,873 A | 3/1998 | Yang | |
| 5,798,170 A | 8/1998 | Zhang et al. | |

(Continued)

FOREIGN PATENT DOCUMENTS

EP    0901176 A2    3/1999

(Continued)

OTHER PUBLICATIONS

Braun. D. et al., Visible light emission from semiconducting polymer diodes, Appl. Phys. Lett., May 6, 1991, 1982-1984, 58(18), American Institute of Physics.
Burroughes, J. H. et al., Light-emitting diodes based on conjugated polymers, Nature, Oct. 11, 1990, 539-541, vol. 347.

*Primary Examiner*—Ahmed Sefer

(57) ABSTRACT

Multilayer anode structures (104) for electronic devices (100) such as polymer light-emitting diodes are described. The multilayer anodes include a high conductivity organic layer (114) adjacent to the photoactive layer (102) and a low conductivity organic layer (112) between the high conductivity organic layer and the anode's electrical connection layer (110). This anode structure provides polymer light emitting diodes which exhibit high brightness, high efficiency and long operating lifetime. The multilayer anode structure of this invention provides sufficiently high resistivity to avoid crosstalk in passively addressed pixellated polymer emissive displays; the multilayer anode structure of this invention simultaneously provides long lifetime for pixellated polymer emissive displays.

10 Claims, 6 Drawing Sheets

U.S. PATENT DOCUMENTS

| | | | |
|---|---|---|---|
| 5,807,627 A | 9/1998 | Friend et al. | |
| 5,844,363 A | 12/1998 | Gu et al. | |
| 5,858,561 A | 1/1999 | Epstein et al. | |
| 5,869,350 A | 2/1999 | Heeger et al. | |
| 5,879,821 A | 3/1999 | Hsieh | |
| 5,902,677 A | 5/1999 | Shi et al. | |
| 5,948,552 A | 9/1999 | Antoniadis et al. | |
| 5,965,979 A | 10/1999 | Friend et al. | |
| 5,993,694 A | 11/1999 | Ito et al. | |
| 6,017,644 A | 1/2000 | Toshida et al. | |
| 6,127,004 A | 10/2000 | Hatwar et al. | |
| 6,208,075 B1 * | 3/2001 | Hung et al. | 313/504 |
| 6,235,414 B1 | 5/2001 | Epstein et al. | |
| 6,249,085 B1 | 6/2001 | Arai | |
| 6,384,528 B1 | 5/2002 | Friend et al. | |
| 6,430,033 B1 | 8/2002 | Mitsui et al. | |
| 6,593,690 B1 * | 7/2003 | McCormick et al. | 313/506 |
| 6,605,483 B2 | 8/2003 | Victor et al. | |
| 6,727,008 B1 * | 4/2004 | Antoniadis et al. | 428/690 |
| 6,850,003 B1 * | 2/2005 | Pichler et al. | 313/506 |
| 2001/0009690 A1 | 7/2001 | Choong et al. | |
| 2002/0011779 A1 | 1/2002 | Towns et al. | |
| 2002/0012848 A1 | 1/2002 | Yuan et al. | |
| 2003/0170456 A1 | 9/2003 | Anderson et al. | |
| 2005/0084713 A1 * | 4/2005 | Kido et al. | 428/690 |
| 2006/0186796 A1 * | 8/2006 | Yabe et al. | 313/504 |

FOREIGN PATENT DOCUMENTS

| | | |
|---|---|---|
| EP | 1020989 A2 | 7/2000 |
| GB | 2 329 740 | 3/1999 |
| JP | 2000/30870 A | 1/2000 |
| JP | 2000/160171 | 5/2000 |
| WO | WO 96/31909 | 10/1996 |
| WO | WO 00/06665 | 2/2000 |
| WO | WO 01/41230 A1 | 6/2001 |

* cited by examiner

MULTILAYER STRUCTURES AS STABLE HOLE-INJECTING ELECTRODES FOR USE IN HIGH EFFICIENCY ORGANIC ELECTRONIC DEVICES

FIELD OF THE INVENTION

This invention relates to organic electronic devices. More particularly it concerns multilayer hole-injecting electrodes (anodes) for electronic devices.

DESCRIPTION OF PRIOR ART

Organic electronic devices, such as light emitting devices, photodetecting devices and photovoltaic cells, may be formed of a thin layer of electroactive organic material sandwiched between two electrical contact layers. Electroactive organic materials are organic materials exhibiting electroluminescence, photosensitivity, charge (hole or electron) transport and/or injection, electrical conductivity, and/or exciton blocking. The material may be semiconductive. At least one of the electrical contact layers is transparent to light so that light can pass through the electrical contact layer-to or from the electroactive organic material layer. Other devices with similar structures include photoconductive cells, photoresistive cells, photodiodes, photoswitches, transistors, capacitors, resistors, chemoresistive sensors (gas/vapor sensitive electronic noses, chemical and biosensors), writing sensors, and electrochromic devices (smart windows).

Light-emitting diodes (LEDs) fabricated with conjugated organic polymer layers as their emissive elements have attracted attention due to their potential for use in display technology [J. H. Burroughs, D. D. C. Bradley, A. R. Brown, R. N. Marks, K. Mackay, R. H. Friend, P. L. Burns, and A. B. Holmes, Nature 347, 539 (1990); D. Braun and A. J. Heeger, Appl. Phys. Lett. 58, 1982 (1991)]. Patents covering polymer LEDs include the following: R. H. Friend, J. H. Burroughs and D. D. Bradley, U.S. Pat. No. 5,247,190; A. J. Heeger and D. Braun, U.S. Pat. Nos. 5,408,109 and 5,869,350. These references as well as all additional articles, patents and patent applications referenced herein are incorporated by reference.

In their most elementary form, these diodes employ a layer of conjugated organic polymer bounded on one side by a hole-injecting electrode (anode) and on the other by an electron-injecting electrode (cathode), one of which is transparent to the light produced in the conjugated polymer layer when a potential is applied across it.

In many applications, especially in displays, arrays of these diodes are assembled. In these applications, there is typically a unit body of active polymer and the electrodes are patterned to provide the desired plurality of pixels in the array. With arrays based on a unit body of active polymer and patterned electrodes there is a need to minimize interference or "cross talk" among adjacent pixels. This need has also been addressed by varying the nature of the contacts between the active polymer body and the electrodes.

The desire to improve operating life and efficiency is often seemingly at cross purposes with the desire to minimize cross talk. High efficiency and long operating life are promoted by the use of high conductivity contacts with the active material layer. Cross talk is minimized when the resistance between adjacent pixels is high. Structures which favor high conductivity and thus high efficiency and long operating life are contrary to the conditions preferred for low cross talk.

In U.S. Pat. No. 5,723,873 it is disclosed that it is advantageous to place a layer of conductive polyaniline (PANI) between the hole-injecting electrode and the layer of active material to increase diode efficiency and to lower the diode's turn on voltage.

Hole-injecting anodes which include conductive polyaniline can provide sufficiently high resistivity to avoid the disadvantage of cross talk in pixellated polymer emissive displays. However, the lifetime of such high resistivity polyaniline devices is not sufficient for many commercial applications. Moreover, devices fabricated with polyaniline-layer-containing anodes require high operating voltages.

Additional developments using a layer of polyaniline or blends comprising polyaniline, directly between the ITO and the light-emitting polymer layer, C. Zhang, G. Yu and Y. Cao [U.S. Pat. No. 5,798,170] demonstrated polymer LEDs with long operating lifetimes.

Despite the advantages of the polymer LED's described in U.S. Pat. No. 5,798,170, the low electrical resistivity typical of polyaniline inhibits the use of polyaniline in pixellated displays. For use in pixellated displays, the polyaniline layer should have a high electrical sheet resistance, otherwise lateral conduction causes cross-talk between neighboring pixels. The resulting interpixel current leakage significantly reduces the power efficiency and limits both the resolution and the clarity of the display.

Making the polyaniline sheet resistance higher by reducing the film thickness is not a good option since thinner films give lower manufacturing yield caused by the formation of electrical shorts. This is demonstrated clearly in FIG. 1, which shows the fraction of "leaky" pixels in a 96×64 array vs thickness of the polyaniline polyblend layer. Thus, to avoid shorts, it is necessary to use a relatively thick polyaniline layer with thickness ~200 nm.

In polymer emissive displays, good operating lifetimes and relatively lower operating voltages have been demonstrated through the use of a layer of poly(ethylenedioxythiophene) (PEDT) between an indium/tin-oxide (ITO) anode layer and the emissive polymer layer. PEDT, as typically prepared, has intrinsically low electrical resistivity. However, for use in pixellated displays, the PEDT layer needs to have a high electrical sheet resistance, otherwise lateral conduction causes cross-talk between neighboring pixels, and the resulting inter-pixel current leakage significantly reduces the power efficiency and limits both the resolution and the clarity of the display.

Thus, there is a need for anode structures for light emitting devices which avoid inter-pixel cross-talk, and which exhibit the low operating voltages and the extended operating lifetimes consistent with the requirements of commercial applications:

SUMMARY OF THE INVENTION

This invention relates generally a multilayer anode structure useful for organic electronic devices, such as diodes and pixellated displays.

The multilayer anode includes a first layer comprising a high conductivity contact layer having a first layer conductivity, a second layer in contact with the first layer, said second layer comprising a conductive organic material having a second layer conductivity, and a third layer in contact with the second layer, said third layer comprising a conductive organic polymer having a third layer conductivity greater than the second layer conductivity and less than the first layer conductivity.

The multilayer structure provides sufficiently high resistivity to avoid cross-talk in passively-addressed pixellated polymer emissive displays; the multilayer anode structure of this invention simultaneously provides the low operating voltages and the long operating lifetime required for pixellated polymer emissive displays in commercial applications.

This invention additionally provides an improved configuration for electronic devices such as pixellated polymer emissive displays. This configuration leads to high efficiency, long operating life PED's while at the same time avoids excessive cross talk. This invention relates generally to the use of the multilayer anode structure in such devices. Thus, in one aspect this invention provides an improved polymer emissive diode. This improved diode is made up of an active emissive polymer layer having a first side in contact with a cathode and a second side in contact with a transparent anode. The improvement involves a multilayer transparent anode itself made up of a high conductivity transparent first contact layer, a transparent second layer in contact with the first contact layer and a third layer in contact with the second layer and the active emissive polymer layer. The second layer contains conjugated conductive organic polymer blend and has a high resistance. The third layer is thin and contains a conductive organic polymer having a lower resistance than the material of the second layer.

While the multilayer electrode of the invention is useful in non-pixelated as well as pixelated electronic devices, the use of these improved multilayer anode structures is particularly advantageous when a plurality of diodes are arranged into an array as occurs in pixellated emissive displays as the anode structure leads to very low levels of cross talk while at the same time providing long life and high efficiency as compared to arrays described heretofore.

In this aspect this invention provides an improved array of polymer emissive diodes. This improved diode array is made up of an active emissive polymer layer having a first side in contact with a patterned cathode and a second side in contact with a patterned transparent anode, the patterning of the anode and cathode defining an array of emissive diodes, the improvement comprising a multilayer transparent anode including a first layer comprising a patterned high conductivity transparent contact layer, a nonpatterned transparent second layer in contact with said first layer, the second layer comprising a blend of conjugated conductive organic polymer and having a higher resistance (lower conductivity) and a nonpatterned transparent third layer in contact with the second layer and with the active emissive polymer layer, the third layer comprising a conductive organic polymer and having a lower resistance (higher conductivity) than the second layer.

As used herein, the term "organic electroactive material" refers to any organic material that exhibits the specified electroactivity, such as electroluminescence, photosensitivity, charge transport and/or charge injection, electrical conductivity and exciton blocking. The term "solution-processed organic electroactive material" refers to any organic electroactive material that has been incorporated in a suitable solvent during layer formation in electronic device assembly. The term "charge" when used to refer to charge injection/transport refers to one or both of hole and electron transport/injection, depending upon the context. The term "photoactive" organic material refers to any organic material that exhibits the electroactivity of electroluminescence and/or photosensitivity. The terms "conductivity" and "bulk conductivity" are used interchangeably, the value of which is provided in the unit of Siemens per centimeter (S/cm). In addition, the terms "surface resistivity" and "sheet resistance" are used interchangeably to refer to the resistance value that is a function of sheet thickness for a given material, the value of which is provided in the unit of ohm per square (ohm/sq). Also, the terms "bulk resistivity" and "electrical resistivity" are used interchangeably to refer to the resistivity that is a basic property of a specific materials (i.e., does not change with the dimension of the substance), the value of which provided in the unit of ohm-centimeter (ohm-cm). Electrical resistivity value is the inverse value of conductivity.

BRIEF DESCRIPTION OF THE DRAWINGS

This invention will be described with~reference being made to the drawings. In these drawings.

DESCRIPTION OF PREFERRED EMBODIMENTS

Figure 2A:
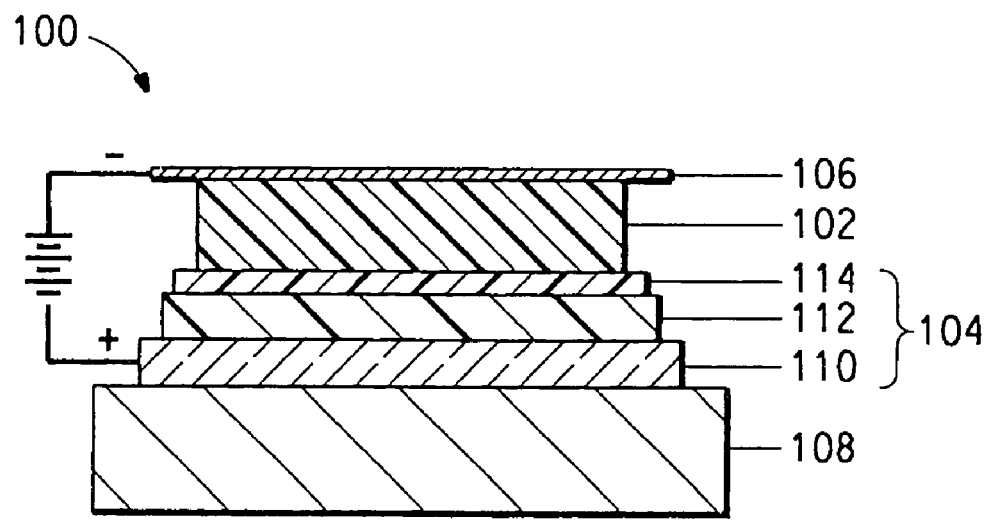
FIG. 2A is a not-to-scale cross-sectional view of a pixel an organic electronic device of the invention containing a photoactive layer.
Figure 2B:
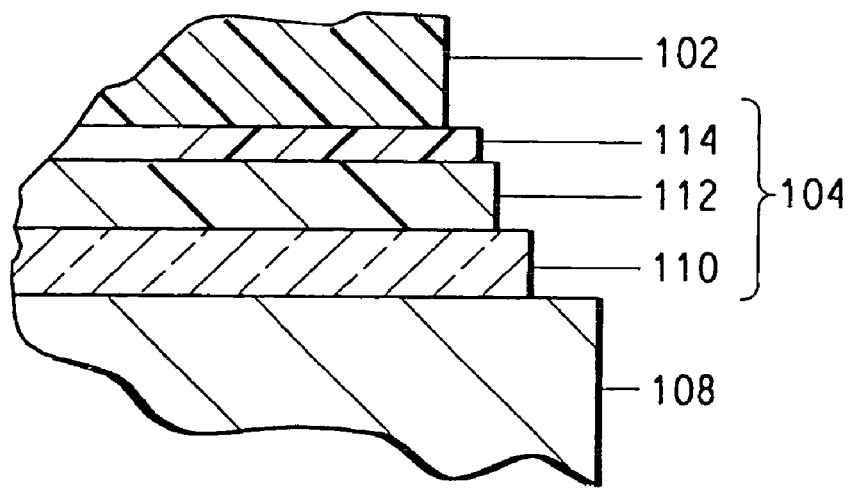
FIG. 2B is an enlarged cross section of the pixel of FIG. 2A focusing on the multilayer anode structure.
Figure 2C:
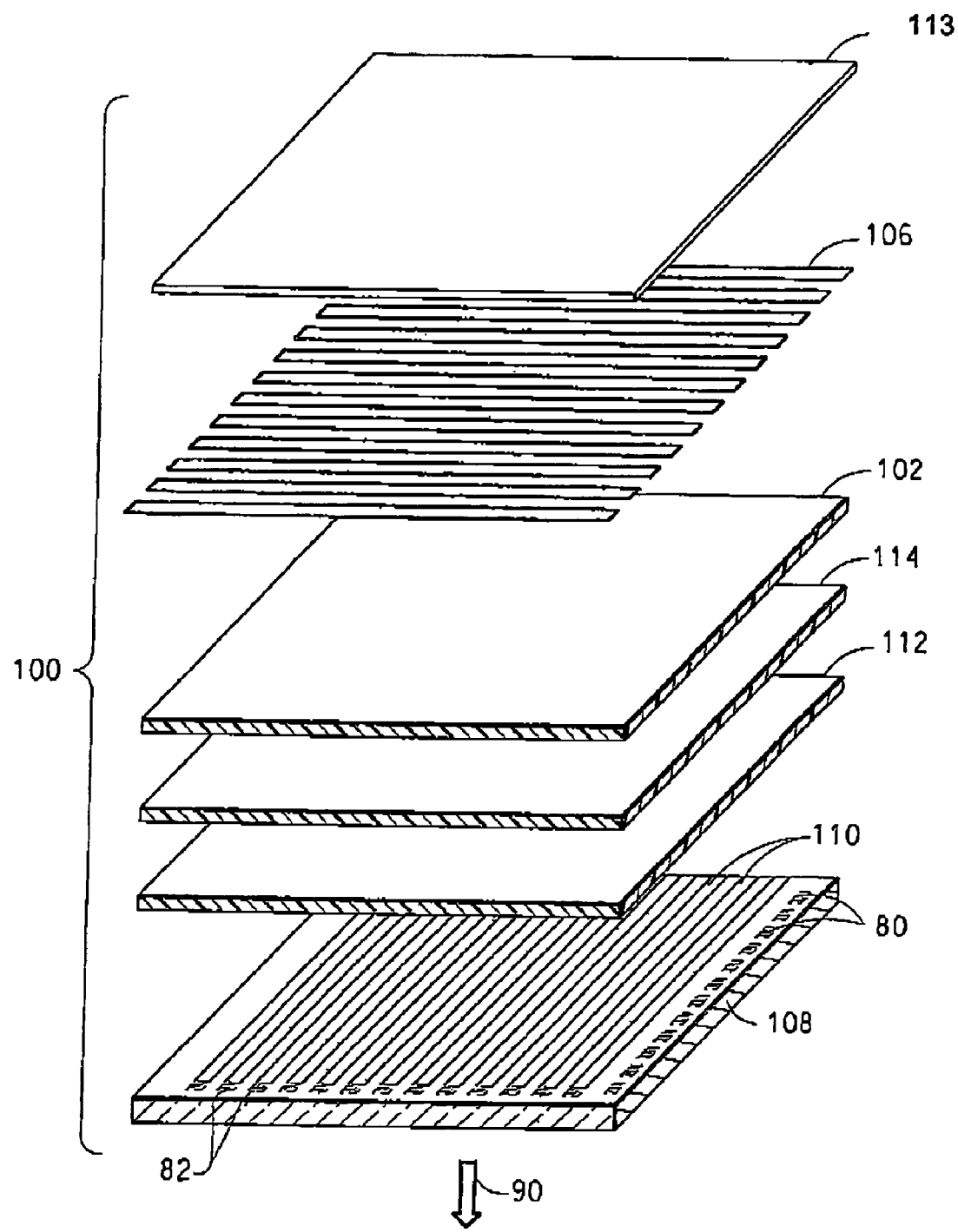
FIG. 2C is a schematic diagram of the architecture of a passively-addressed, pixellated, organic electronic device of the invention containing a photoactive layer.

As best seen in FIGS. 2A, 2B, and 2C, an electronic device 100 of this invention comprises a layer of photoactive layer 102 between a cathode 106 and a multilayer anode 104. Anode 104 includes a conductive first layer 110 having a first layer conductivity, a low conductivity second layer 112 having a second layer conductivity and a high conductivity third layer 114 having a third layer conductivity greater than the second layer conductivity and less than the first layer conductivity. Anode 104 and the overall diode structure can be carried on a substrate 108.

Organic polymer-based diode 100 employs a relatively high work function anode; this high work function anode 104 serving to inject holes into the otherwise filled π-band of the semiconducting, luminescent polymer 102. Relatively low work function materials are preferred as the cathode 106; this low work function cathode serving to inject electrons into the otherwise empty π*-band of the semiconducting, luminescent polymer 102. The holes injected at the anode and the electrons injected at the cathode recombine radiatively within the active layer and light is emitted. The criteria for suitable electrodes in the art are described in detail by I. D. Parker, J. Appl. Phys, 75, 1656 (1994).

Device Configuration:

As best seen in FIG. 2C, each individual pixel of an organic electronic device 100 includes an electron injecting (cathode)

contact 106 as one electrode on the front of a photoactive organic material 102 deposited on a multilayer anode 104 of the invention to serve as the second (transparent) electron-withdrawing (anode) electrode. The multilayer anode (made of layers 110, 112 and 114) is deposited on a substrate 108, which is partially coated with a first layer 110. Deposited on top of first layer 110 is the low conductivity second layer 112 and the high conductivity third layer 114. Cathode 106 is electrically connected to contact pads 80, and anode 110 is electrically connected to contact pads 82. The layers 102, 106, 108, 110, and 112 are then isolated from the environment by a hermetic seal layer 113. Where to electronic device is a light-emitting device, upon application of electricity via contact pads 80, 82, which pads are outside of the hermetic seal 70, light is emitted from the device in the direction shown by arrow 90. Where the electronic device is a photodetector, light is received by the deice in the direction opposite the row 90 (not shown).

This description of preferred embodiments is organized according to these various components. More specifically it contains the following sections:
   The Photoactive layer (102)
   The Multilayer Anode (104)
      The Conductive First Layer (110)
      The Low Conductivity Second Layer (112)
      The High Conductivity Third Layer (114)
   The Cathode (106)
   The Substrate (108)
   Contact Pads (80, 90)
   Optional Layers
   Fabrication Techniques The Photoactive Layer (102)

Depending upon the application of the electronic device, the photoactive layer 102 can be a light-emitting layer that is activated by an applied voltage (such as in a light-emitting diode or light-emitting electrochemical cell), a layer of material that responds to radiant energy and generates a signal with or without an applied bias voltage (such as in a photodetector). Examples of photodetectors include photoconductive cells, photoresistors, photos witches, phototransistors, and phototubes, and photovoltaic cells, as these terms are describe in Markus, John, *Electronics and Nucleonics Dictionary*, 470 and 476 (McGraw-Hill, Inc. 1966).

Where the electronic device is a light-emitting device, the photoactive layer 102 will emit light when sufficient bias voltage is applied to the electrical contact layers. Suitable active light-emitting materials include organic molecular materials such asanthracene, butadienes, coumarin derivatives, acridine, and stilbene derivatives, see, for example, Tang, U.S. Pat. No. 4,356,429, Van Slyke et al., U.S. Pat. No. 4,539,507, the relevant portions of which are incorporated herein by reference. Alternatively, such materials can be polymeric materials such as those described in Friend et al. (U.S. Pat. No. 5,247,190), Heeger et al. (U.S. Pat. No. 5,408,109), Nakano et al. (U.S. Pat. No. 5,317,169), the relevant portions of which are incorporated herein by reference. The light-emitting materials may be dispersed in a matrix of another material, with and without additives, but preferably form a layer alone. In preferred embodiments, the electroluminescent polymer comprises at least one conjugated polymer or a co-polymer which contains segments of $\pi$-conjugated moieties. Conjugated polymers are well known in the art (see, e.g., Conjugated Polymers, J. L. Bredas and R. Silbey edt., Kluwer Academic Press, Dordrecht, 1991). Representative classes of materials include, but are not limited to the following:

(i) poly(p-phenylene vinylene) and its derivatives substituted at various positions on the phenylene moiety;

(ii) poly(p-phenylene vinylene) and its derivatives substituted at various positions on the vinylene moiety;

(iii) poly(arylene vinylene), where the arylene may be such moieties as naphthalene, anthracene, furylene, thienylene, oxadiazole, and the like, or one of the moieties with functionalized substituents at various positions;

(iv) derivatives of poly(arylene vinylene), where the arylene may be as in (iii) above, substituted at various positions on the arylene moiety;.

(v) derivatives of poly(arylene vinylene), where the arylene may be as in (iii) above, substituted at various positions on the vinylene moiety;

(vi) co-polymers of arylene vinylene oligomers with non-conjugated oligomers, and derivatives of such polymers substituted at various positions on the arylene moieties, derivatives of such polymers substituted at various positions on the vinylene moieties, and derivatives of such polymers substituted at various positions on the arylene and the vinylene moieties;

(vii) poly(p-phenylene) and its derivatives substituted at various positions on the phenylene moiety, including ladder polymer derivatives such as poly(9,9-dialkyl fluorene) and the like;

(viii) poly(arylenes) and their derivatives substituted at various positions on the arylene moiety;

(ix) co-polymers of oligoarylenes with non-conjugated oligomers, and derivatives of such polymers substituted at various positions on the arylene moieties;

(x) polyquinoline and its derivatives;

(xi) co-polymers of polyquinoline with p-phenylene and moieties having solubilizing function;

(xii) rigid rod polymers such as poly(p-phenylene-2,6-benzobisthiazole), poly(p-phenylene-2,6-benzobisoxazole), poly(p-phenylene-2,6-benzimidazole), and their derivatives; and the like.

More specifically, the active materials may include but are not limited to poly(phenylenevinylene), PPV, and alkoxy derivatives of PPV, such as for example, poly(2-methoxy-5-(2'-ethyl-hexyloxy)-p-phenylenevinylene) or "MEH-PPV" (U.S. Pat. No. 5,189,136). BCHA-PPV is also an attractive active material. (C. Zhang, et al, J. Electron. Mater., 22, 413 (1993)). PPPV is also suitable. (C. Zhang et al, Synth. Met., 62, 35 (1994) and references therein.) Luminescent conjugated polymer which are soluble in common organic solvents are preferred since they enable relatively simple device fabrication [A. Heeger and D. Braun, U.S. Pat. Nos. 5,408,109 and 5,869,350].

Even more preferred active light-emitting polymers and copolymers are the soluble PPV materials described in H. Becker et al., Adv. Mater. 12, 42 (2000) and referred to herein as C-PPV's. Blends of these and other semi-conducting polymers and copolymers which exhibit electroluminescence can be used. Where the electronic device 100 is a photodetector, the photoactive layer 102 responds to radiant energy and produces a signal either with or without a biased voltage. Materials that respond to radiant energy and is capable of generating a signal with a biased voltage (such as in the case of a photoconductive cells, photoresistors, photoswitches, phototransistors, phototubes) include, for example, many conjugated polymers and electroluminescent materials. Materials that respond to radiant energy and are capable of generating a signal without a biased voltage (such as in the case of a photoconductive cell or a photovoltaic cell) include materials that chemically react to light and thereby generate a signal. Such light-sensitive chemically reactive materials include for example, many conjugated polymers and electro- and photo-luminescent materials. Specific examples include, but are not limited to, MEH-PPV ("Optocoupler made from semiconducting polymers", G. Yu, K. Pakbaz, and A. J. Heeger, *Journal of Electronic Materials,* Vol. 23, pp 925-928 (1994); and MEH-PPV Composites with CN-PPV ("Efficient Photodiodes from Interpenetrating Polymer Networks", J. J. M. Halls et al. (Cambridge group) *Nature* Vol. 376, pp. 498-500, 1995). The electroactive organic materials can be tailored to provide emission at various wavelengths.

In some embodiments, the polymeric photoactive material or organic molecular photoactive material is present in the photoactive layer 102 in admixture from 0% to 75% (w, basis overall mixture) of carrier organic material (polymeric or organic molecular). The criteria for the selection of the carrier organic material are as follows. The material should allow for the formation of mechanically coherent films, at low concentrations, and remain stable in solvents that are capable of dispersing, or dissolving the conjugated polymers for forming the film. Low concentrations of carrier materials are preferred in order to minimize processing difficulties, i.e., excessively high viscosity or the formation of gross in homogeneities; however the concentration of the carrier should be high enough to allow for formation of coherent structures. Where the carrier is a polymeric material, preferred carrier polymers are high molecular weight (M.W.>100,000) flexible chain polymers, such as polyethylene, isotactic polypropylene, polyethylene oxide, polystyrene, and the like. Under appropriate conditions, which can be readily determined by those skilled in the art, these macromolecular materials enable the formation of coherent structures from a wide variety of liquids, including water, acids, and numerous polar and non-polar organic solvents. Films or sheets manufactured using these carrier polymers have sufficient mechanical strength at polymer concentrations as low as 1%, even as low as 0.1%, by volume to enable the coating and subsequent processing as desired. Examples of such coherent structures are those comprised of poly(vinyl alcohol), poly (ethylene oxide), poly-para (phenylene terephthalate), poly-para-benzamide, etc., and other suitable polymers. On the other hand, if the blending of the final polymer cannot proceed in a polar environment, non-polar carrier structures are selected, such as those containing polyethylene, polypropylene, poly(butadiene), and the like.

Typical film thicknesses of the photoactive layers range from a few hundred Ångstrom units (200 Å) to several thousand Ångstrom units (10,000 Å) (1 Ångstrom unit=$10^{-8}$ cm). Although the active film thicknesses are not critical, device performance can typically be improved by using thinner films. Preferred thickness are from 300 Å to 5,000 Å.

The Multilayer Anode (104)

The multilayer anode (104) includes the conductive first layer (110), a low conductivity second layer (112) and a high conductivity third layer (114).

The thickness of each layer 110, 112, 114 is determined by the desired transparency and resistivity of such layer, such transparency and resistivity factors are in turn dependent upon the composition of the layer.

In the device of the invention that contains a photoactive layer, one electrode is transparent to enable light emission from the device or light reception by the device. Most commonly the anode is the transparent electrode, although the present invention can also be used in an embodiment where the cathode is the transparent electrode.

As used herein, the term "transparent" is defined to mean "capable of transmitting at least about 25%, and preferably at least about 50%, of the amount of light of a particular wavelength of interest". Thus a material is considered "transparent" even if its ability to transmit light varies as a function of wave length but does meet the 25% or 50% criteria at a given wavelength of interest. As is known to those working in the field of thin films, one can achieve considerable degrees of transparency with metals if the layers are thin enough, for example in the case of silver and gold below about 300 Å, and especially from about 20 Å to about 250 Å with silver having a relatively colorless (uniform) transmittance and gold tending to favor the transmission of yellow to red wavelengths. Similarly, for materials such as ITO, PANI and PEDT, transparency can be achieved with a layer ranging from 100 Å to 10,000 Å.

In addition to the desired transparency, the composition of layers in the multilayer anode 104 should also be chosen so that the third layer conductivity is less than the first layer conductivity and more than the second layer conductivity. Therefore, the choice of material for one layer of the multilayer anode depends upon the composition of the other layers in the anode and the corresponding conductivities of such other layers. Other factors in determining composition are described below in sections relating to the specific layers.

The Conductive First Layer (110)

The conductive first layer has low resistance: preferably less than 300 ohms/square and more preferably less than 100 ohms/square.

The conductive first layer (110) of the composite anode (104) provides electrical contact with an external electrical source (not shown) and is a conductive layer made of a high work function material, most typically an inorganic material with a work function above about 4.5 eV. The conductive first layer 110 is preferably made of materials containing a metal, mixed metal, alloy, metal oxide or mixed-metal oxide. Suitable metals include the Group 11 metals, the metals in Groups 4, 5, and 6, and the Group 8-10 transition metals. If the anode 104 is to be light-transmitting, mixed-metal oxides of Groups 12, 13 and 14 metals, such as indium-tin-oxide, are generally used. The IUPAC numbering system is used throughout, where the groups from the Periodic Table are numbered from left to right as 1-18 (CRC Handbook of Chemistry and Physics, 81$^{st}$ Edition, 2000). The first layer 110 may also comprise an organic material such as polyaniline as described in "Flexible light-emitting diodes made from soluble conducting polymer," *Nature* vol. 357, pp 477-479 (11 Jun. 1992).

Typical inorganic materials which serve as anodes include metals such as aluminum, silver, platinum, gold, palladium, tungsten, indium, copper, iron, nickel, zinc, lead and the like; metal oxides such as lead oxide, tin oxide, indium/tin-oxide and the like; graphite; doped inorganic semiconductors such as silicon, germanium, gallium arsenide, and the like. When metals such as aluminum, silver, platinum, gold, palladium, tungsten, indium, copper, iron, nickel, zinc, lead and the like are used, the anode layer should be sufficiently thin to be semi-transparent. Metal oxides such as indium/tin-oxide are typically at least semitransparent.

Where the anode is transparent, the conductive metal-metal oxide mixtures can be transparent as well at thicknesses up to as high as 2500 Å in some cases. Preferably, the thicknesses of metal-metal oxide (or dielectric) layers is from about 25 to about 1200 Å when transparency is desired.

The Low Conductivity Second Layer (112)

The second layer 112 should have sufficient high resistivity to prevent cross talk or current leakage from the multilayer anode and provide sufficient hole injection/transport. The low conductivity second layer preferably has a bulk conductivity of from about $10^{-4}$ S/cm to $10^{-11}$ S/cm. More preferably, the second layer has a bulk conductivity of from $10^{-5}$ S/r to $10^{-8}$ S/cm.

The second layer 112 may comprise polyaniline (PANI) or an equivalent conjugated conductive polymer such as polypyrole or polythiophene, most commonly in a blend with one or more nonconductive polymers. Polyaniline is particularly useful. Most commonly it is in the emeraldine salt (ES) form. Useful conductive polyanilines include the homopolymer and derivatives usually as blends with bulk polymers (also known as host polymers). Examples of PANI are those disclosed in U.S. Pat. No. 5,232,631.

In another embodiment, the second layer may include conductive materials such as N,N'-diphenyl-N,N'-bis(3-methylphenyl)-[1,1'-biphenyl]-4,4'-diamine (TPD) and bis[4-(N, N-diethylamino)-2-methylphenyl](4-methylphenyl)methane (MPMP), and hole injection/transport polymers such as polyvinylcarbazole (PVK), (phenylmethyl)polysilane, poly(3,4-ethylenedioxythiophene) (PEDOT), and polyaniline (PANI);electron and hole injection/transporting materials such as 4,4'-N,N'-dicarbazole biphenyl (BCP); or light-emitting materials with good electron and hole transport properties, such as chelated oxinoid compounds, such as tris (8-hydroxyquinolato)aluminum ($Alq_3$).

When the terms "polyaniline" or PANI are used herein, they are used generically to include substituted and unsubstituted materials, as well as other equivalent conjugated conductive polymers such as the polypyrroles, or the polythiophenes, for example poly(ethylenedioxythiophene) ("PEDT") unless the context is clear that only the specific nonsubstituted form is intended. It is also used in a manner to include any accompanying dopants, particularly acidic materials used to render the polyaniline conductive.

In general, polyanilines are polymers and copolymers of film and fiber-forming molecular weight derived from the polymerization of unsubstituted and substituted anilines of the Formula I:

Formula 1

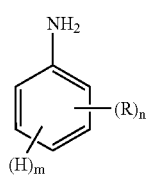

wherein
n is an integer from 0 to 4;
m is an integer from 1 to 5 with the proviso that the sum of n and m is equal to 5; and
R is independently selected so as to be the same or different at each occurrence and is selected from the group consisting of alkyl, alkenyl, alkoxy, cycloalkyl, cycloalkenyl, alkanoyl, alkythio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfonyl, alkoxycarbonyl, arylsulfonyl, carboxylic acid, halogen, cyano, or alkyl substituted with one or more sulfonic acid, carboxylic acid, halo, nitro, cyano or epoxy moieties; or carboxylic acid, halogen, nitro, cyano, or sulfonic acid moieties; or any two R groups together may form an alkylene or alkenylene chain completing a 3, 4, 5, 6 or 7-membered aromatic or alicyclic ring, which ring may optionally include one or more divalent nitrogen, sulfur or oxygen atoms. Without intending to limit the scope of this invention, the size of the various R groups ranges from about 1 carbon (in the case of alkyl) through 2 or more carbons up through about 20 carbons with the total of n Rs being from about 1 to about 40 carbons.

Illustrative of the polyanilines useful in the practice of this invention are those of the Formula II to V:

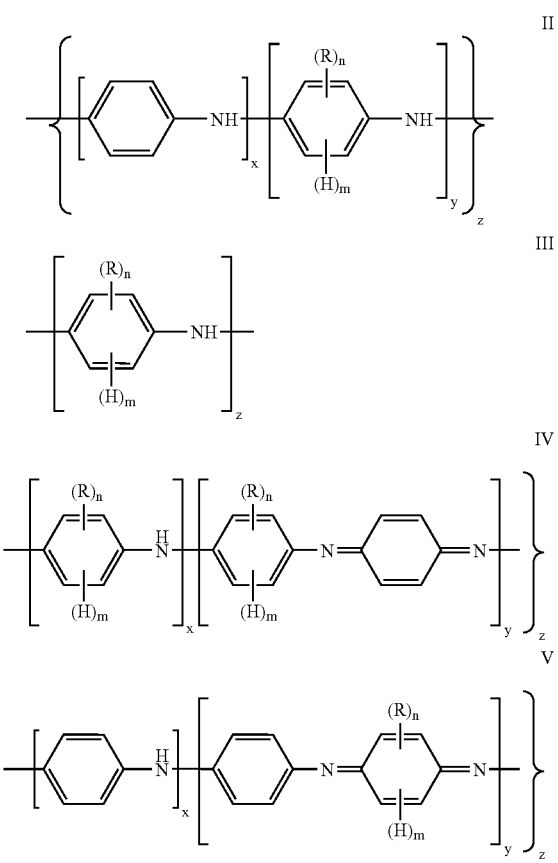

wherein:
n, m and R are as described above except that m is reduced by 1 as a hydrogen is replaced with a covalent bond in the polymerization and the sum of n plus m equals 4;
y is an integer equal to or greater than 0;
x is an integer equal to or greater than 1, with the proviso that the sum of x and y is greater than 1; and
z is an integer equal to or greater than 1.

The following listing of substituted and unsubstituted anilines are illustrative of those which can be used to prepare polyanilines useful in the practice of this invention.

| | |
|---|---|
| Aniline | 2,5-Dimethylaniline |
| o-Toluidine | 2,3-Dimethylaniline |
| m-Toluidine | 2,5-Dibutylaniline |
| o-Ethylaniline | 2,5-Dimethoxyaniline |
| m-Ethylaniline | Tetrahydronaphthylamine |
| o-Ethoxyaniline | o-Cyanoaniline |
| m-Butylaniline | 2-Thiomethylaniline |
| m-Hexylaniline | 2,5-Dichloroaniline |
| m-Octylaniline | 3-(n-Butanesulfonic acid) aniline |
| 4-Bromoaniline | |
| 2-Bromoaniline | |
| 3-Bromoaniline | 2,4-Dimethoxyaniline |
| 3-Acetamidoaniline | 4-Mercaptoaniline |

| | |
|---|---|
| 4-Acetamidoaniline | 4-Methylthioaniline |
| 5-Chloro-2-methoxyaniline | 3-Phenoxyaniline |
| 5-Chloro-2-ethoxyaniline | 4-Phenoxyaniline |

Illustrative of useful R groups are alkyl, such as methyl, ethyl, octyl, nonyl, tert-butyl, neopentyl, isopropyl, sec-butyl, dodecyl and the like, alkenyl such as 1-propenyl, 1-butenyl, 1-pentenyl, 1-hexenyl, 1-heptenyl, 1-octenyl and the like; alkoxy such as propoxy, butoxy, methoxy, isopropoxy, pentoxy, nonoxy, ethoxy, octoxy, and the like, cycloalkenyl such as cyclohexenyl, cyclopentenyl and the like; alkanoyl such as butanoyl, pentanoyl, octanoyl; ethanoyl, propanoyl and the like; alkylsulfinyl, alkysulfonyl, alkylthio, arylsulfonyl, arylsulfinyl, and the like, such as butylthio, neopentylthio, methylsulfinyl, benzylsulfinyl, phenylsulfinyl, propylthio, octylthio, nonylsulfonyl, octylsulfonyl, methylthio, isopropylthio, phenylsulfonyl, methylsulfonyl, nonylthio, phenylthio, ethylthio, benzylthio, phenethylthio, naphthylthio and the like; alkoxycarbonyl such as methoxycarbonyl, ethoxycarbonyl, butoxycarbonyl and the like, cycloalkyl such as cyclohexyl, cyclopentyl, cyclooctyl, cycloheptyl and the like; alkoxyalkyl such as methoxymethyl, ethoxymethyl, butoxymethyl, propoxyethyl, pentoxybutyl and the like; aryloxyalkyl and aryloxyaryl such as phenoxyphenyl, phenoxymethylene and the like; and various substituted alkyl and aryl groups such as 1-hydroxybutyl, 1-aminobutyl, 1-hydroxypropyl, 1-hydyroxypentyl, 1-hydroxyoctyl, 1-hydroxyethyl, 2-nitroethyl, trifluoromethyl, 3,4-epoxybutyl, cyanomethyl, 3-chloropropyl, 4-nitrophenyl, 3-cyanophenyl, and the like; sulfonic acid terminated alkyl and aryl groups and carboxylic acid terminated alkyl and aryl groups such as ethylsulfonic acid, propylsulfonic acid, butylsulfonic acid, phenylsulfonic acid, and the corresponding carboxylic acids.

Also illustrative of useful R groups are divalent moieties formed from any two R groups such as moieties of the formula:

wherein n* is an integer from about 3 to about 7, as for example —(CH$_2$)$_{-4}$, —(CH$_2$)$_{-3}$ and —(CH$_2$)$_{-5}$, or such moieties which optionally include heteroatoms of oxygen and sulfur such as —CH$_2$SCH$_2$— and —CH$_2$—O—CH$_2$—. Exemplary of other useful R groups are divalent alkenylene chains including 1 to about 3 conjugated double bond unsaturation such as divalent 1,3-butadiene and like moieties.

Preferred for use in the practice of this invention are polyanilines of the above Formulas II to V in which:

n is an integer from 0 to about 2;

m is an integer from 2 to 4, with the proviso that the sum of n and m is equal to 4;

R is alkyl or alkoxy having from 1 to about 12 carbon atoms, cyano, halogen, or alkyl substituted with carboxylic acid or sulfonic acid substituents;

x is an integer equal to or greater than 1;

y is an integer equal to or greater than 0, with the proviso that the sum of x and y is greater than about 4, and z is an integer equal to or greater than about 5.

In more preferred embodiments of this invention, the polyamline is derived from unsubstituted aniline, i.e., where n is 0 and m is 5 (monomer) or 4 (polymer). In general, the number of monomer repeat units is at least about 50.

As described in U.S. Pat. No. 5,232,631, the polyaniline is rendered conductive by the presence of an oxidative or acidic species. Acidic species and particularly "functionalized protonic acids" are preferred in this role. A "functionalized protonic acid" is one in which the counter-ion has been functionalized preferably to be compatible with the other components of this layer. As used herein, a "protonic acid" is an acid that protonates the polyaniline to form a complex with said polyaniline.

In general, functionalized protonic acids for use in the invention are those of Formulas VI and VII:

$$A\text{-}R \quad\quad\quad VI$$

or

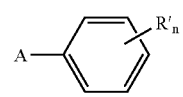

VII wherein:

A is sulfonic acid, selenic acid, phosphoric acid, boric acid or a carboxylic acid group; or hydrogen sulfate, hydrogen selenate, hydrogen phosphate;

n is an integer from 1 to 5;

R is alkyl, alkenyl, alkoxy, alkanoyl, alkylthio, alkylthioalkyl, having from 1 to about 20 carbon atoms; or alkylaryl, arylalkyl, alkylsulfinyl, alkoxyalkyl, alkylsulfonyl, alkoxycarbonyl, carboxylic acid, where the alkyl or alkoxy has from 0 to about 20 carbon atoms; or alkyl having from 3 to about 20 carbon atoms substituted with one or more sulfonic acid, carboxylic acid, halogen, nitro, cyano, diazo, or epoxy moieties; or a substituted or unsubstituted 3, 4, 5, 6 or 7 membered aromatic or alicyclic carbon ring, which ring may include one or more divalent heteroatoms of nitrogen, sulfur, sulfinyl, sulfonyl or oxygen such as thiophenyl, pyrolyl, furanyl, pyridinyl.

In addition to these monomeric acid forms, R can be a polymeric backbone from which depend a plurality of acid functions "A." Examples of polymeric acids include sulfonated polystyrene, sulfonated polyethylene and the like. In these cases the polymer backbone can be selected either to enhance solubility in nonpolar substrates or be soluble in more highly polar substrates in which materials such as polymers, polyacrylic acid or poly(vinylsulfonate), or the like, can be used.

R' is the same or different at each occurrence and is alkyl, alkenyl, alkoxy, cycloalkyl, cycloalkenyl, alkanoyl, alkylthio, aryloxy, alkylthioalkyl, alkylaryl, arylalkyl, alkylsulfinyl, alkoxyalkyl, alkylsulfonyl, aryl, arylthio, arylsuldmyl, alkoxycarbonyl, arylsulfonyl, carboxylic acid, halogen, cyano, or alkyl substituted with one or more sulfonic acid, carboxylic acid, halogen, nitro, cyano, diazo or epoxy moieties; or any two R substituents taken together are an alkylene or alkenylene group completing a 3, 4, 5, 6 or 7 membered aromatic or alicyclic carbon ring or multiples thereof, which ring or rings may include one or more divalent heteroatoms of nitrogen, sulfur, sulEmyl, sulfonyl or oxygen. R' typically has from about 1 to about 20 carbons especially 3 to 20 and more especially from about 8 to 20 carbons.

Materials of the above Formulas VI and VII are preferred in which:

A is sulfonic acid, phosphoric acid or carboxylic acid;

n is an integer from 1 to 3;

R is alkyl, alkenyl, alkoxy, having from 6 to about 14 carbon atoms; or arylalkyl, where the alkyl or alkyl portion or alkoxy has from 4 to about 14 carbon atoms; or alkyl having from 6 to about 14 carbon atoms substituted with one or more, carboxylic acid, halogen, diazo, or epoxy moieties;

R' is the same or different at each occurrence and is alkyl, alkoxy, alkylsulfonyl, having from 4 to 14 carbon atoms, or alkyl substituted with one or more halogen moieties again with from 4 to 14 carbons in the alkyl.

Among the particularly preferred embodiments, most preferred for use in the practice of this invention are functionalized protonic acids of the above Formulas VI and VII in which:

A is sulfonic acid;

n is the integer 1 or 2;

R is alkyl or alkoxy, having from 6 to about 14 carbon atoms; or alkyl having from 6 to about 14 carbon atoms substituted with one or more halogen moieties;

R' is alkyl or alkoxy, having from 4 to 14, especially 12 carbon atoms, or alkyl substituted with one or more halogen, moieties.

Preferred functionalized protonic acids are organic sulfonic acids such as dodecylbenzene sulfonic acid and more preferably poly(2-acrylamido-2-methyl-1-propanesulfonic acid) ("PAAMPSA").

The amount of functionalized protonic acid employed can vary depending on the degree of conductivity required. In general, sufficient functionalized protonic acid is added to the polyaniline-containing admixture to form a conducting material. Usually the amount of functionalized protonic acid employed is at least sufficient to give a conductive polymer (either in solution or in solid form).

The polyaniline can be conveniently used in the practice of this invention in any of its physical forms. Illustrative of useful forms are those described in Green, A. G., and Woodhead, A. E., J. Chem. Soc., 101, 1117 (1912) and Kobay.ashi, et al., J. Electroanl. Chem., 177, 281-91 (1984), which are hereby incorporated by reference. For unsubstituted polyaniline, useful forms include leucoemeraldine, protoemeraldine, emeraldine, nigraniline and tolu-protoemeraldine forms, with the emeraldine form being preferred.

Copending PCT Patent Application No. PCT/US00/32545 of Cao, Y. and Zhang, C. discloses the formation of low conductivity blends of conjugated polymers with non-conductive polymers and is incorporated herein by reference.

The particular bulk polymer or polymers added to the conjugated polymer can vary. The selection of materials can be based upon the nature of the conductive polymer, the method used to blend the polymers and the method used to deposit the layer in the device.

The materials can be blended by dispersing one polymer in the other, either as a dispersion of small-particles or as a solution of one polymer in the other. The polymer are typically admixed in a fluid phase and the layer is typically laid out of a fluid phase.

We have had our best results using water-soluble or water-dispensable conjugated polymers together with water-soluble or water-dispensable bulk polymers. In this case, the blend can be formed by dissolving or dispersing the two polymers in water and casting a layer from the solution or dispersion.

Organic solvents can be used with organic-soluble or organic dispensable conjugated polymers and bulk polymers. In addition, blends can be formed using melts of the two polymers or by using a liquid prepolymer or monomer form of the bulk polymer which is subsequently polymerized or cured into the desired final material.

In those presently preferred cases where the PANI is water-soluble or water dispersable and it is desired to cast the PANI layer from an aqueous solution, the bulk polymer should be water soluble or water dispersible. In such cases, it is selected from, for example polyacrylamides (PAM), poly(acrylic acid) (PAA) poly(vinyl pyrrolidone) (PVPd), acrylamide copolymers, cellulose derivatives, carboxyvinyl polymer, poly(ethylene glycols), poly(ethylene oxide) (PEO), poly(vinyl alcohol) (PVA), poly(vinyl methyl ether), polyamines, polyimines, polyvinylpyridines, polysaccharides, end polyurethane dispersions.

In the case where it is desired to cast the layer from a non-aqueous solution or dispersion the bulk polymer may be selected from, for example liquefiable polyethylenes, isotactic polypropylene, polystyrene, poly(vinylalcohol), poly(ethylvinylacetate), polybutadienes, polyisoprenes, ethylenevinylene-copolymers, ethylene-propylene copolymers, poly (ethyleneterephthalate), poly(butyleneterephthalate) and nylons such as nylon 12, nylon 8, nylon 6, nylon 6.6 and the like, polyester materials, polyamides such as polyacrylamides and the like.

In those cases where one polymer is being dispersed in the other, the common solubility of the various polymers may not be required.

The relative proportions of the polyaniline and bulk polymer or prepolymer can vary. For each part of polyaniline there can be from 0 to as much as 20 parts by weight of bulk polymer or prepolymer with 0.5 to 10 and especially 1 to 4 parts of bulk material being present for each part of PANI.

Solvents for the materials used to cast this layer are selected to compliment the properties of the polymers.

In the preferred systems, the PANI and bulk polymer are both water-soluble or water-dispersible and the solvent system is an aqueous solvent system such as water or a mixture of water with one or more polar organic materials such as lower oxyhydrocarbons for example lower alcohols, ketones and esters.

These materials include, without limitation, water mixed with methanol, ethanol, isopropanol, acetone methyl ethyl ketone and the like.

If desired, but generally not preferred, a solvent system of polar organic liquids could be used.

In the case of conducting polymers such as PAM and bulk polymers which are not water-soluble or water-dispersible, nonpolar solvents are most commonly used.

Illustrative of useful common nonpolar solvents are the following materials: substituted or unsubstituted aromatic hydrocarbons such as benzene, toluene, p-xylene, m-xylene, naphthalene, ethylbenzene, styrene, aniline and the like; higher alkanes such as pentane, hexane, heptane, octane, nonane, decane and the like; cyclic alkanes such as decahydronaphthalene; halogenated alkanes such as chloroform, bromoform, dichloromethane and the like; halogenated aromatic hydrocarbons such as chlorobenzene, o-dichlorobenzene, m-dichlorobenzene, p-dichlorobenzene and the like; higher alcohols such as 2-butanol, 1-butanol, hexanol, pentanol, decanol, 2-methyl-1-propanol and the like; higher ketones such as hexanone, butanone, pentanone and the like; heterocyclics such as morpholine; perfluorinated hydrocarbons such as perfluorodecaline, perfluorobenzene and the like.

Figure 1:
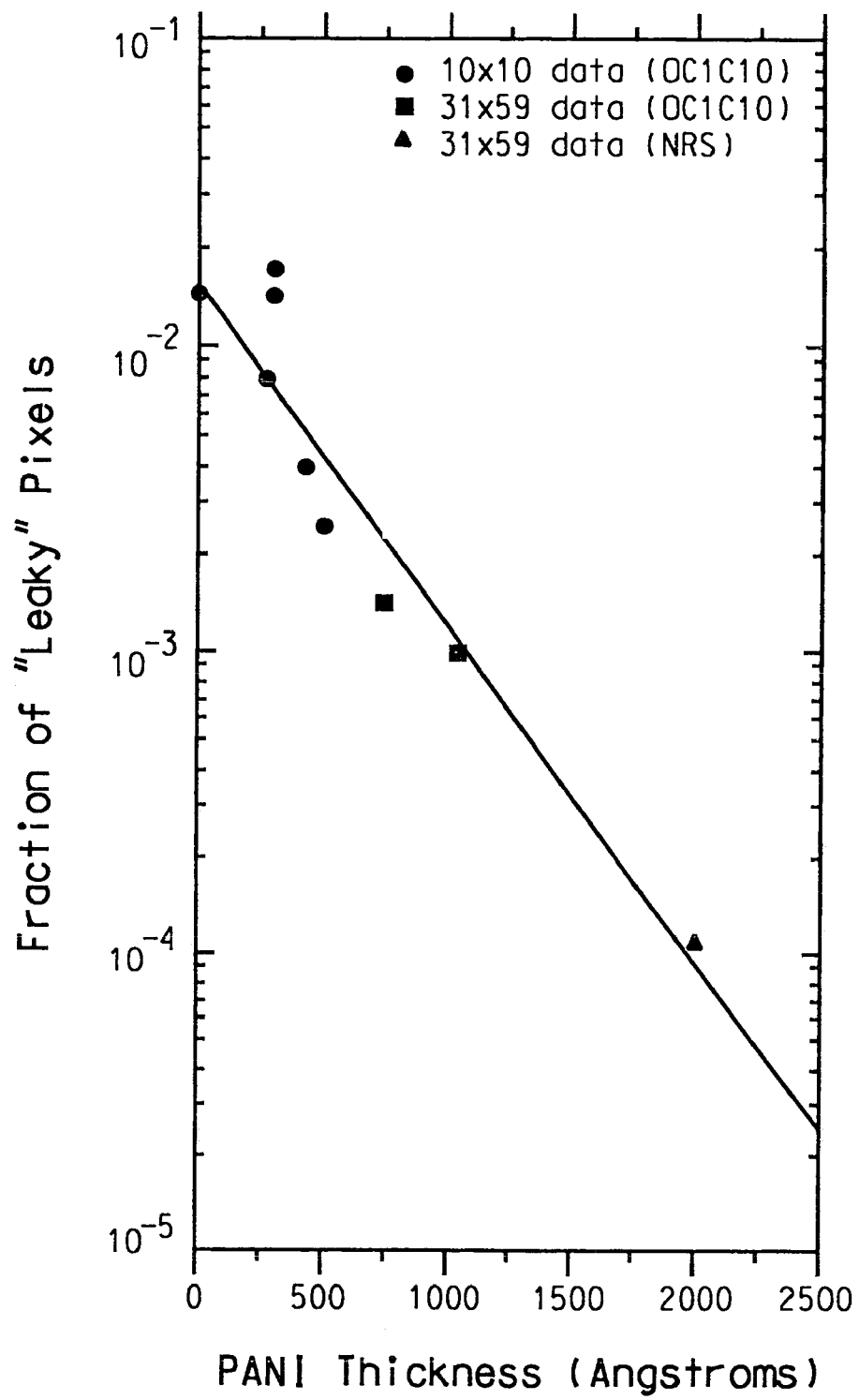
FIG. 1 is a graph referenced in the Background which shows the fraction of "leaky" pixels (in a 96 by 64 array) vs thickness of a polyaniline layer.

The thickness of the second layer 112 will be chosen with the properties of the diode in mind. In those situations where the composite anode is to be transparent, it is generally preferable to have the layer of PANI as thin as practically possible bearing in mind the failure problem noted in FIG. 1. Typical thicknesses range from about 100 Å to about 5000 Å. When transparency is desired, thicknesses of from about 100 Å to about 3000 Å are preferred and especially about 2000 Å.

Where the second layer 112 comprises a PANI(ES) blend and a film thickness of 200 nm or greater, the electrical resistivity of the second layer should be greater than or equal to $10^4$ ohm-cm to avoid cross talk and inter-pixel current leakage. Values in excess of $10^5$ ohm-cm are preferred. Even at $10^5$ ohm-cm, there is some residual current leakage and consequently some reduction in device efficiency. Thus, values of approximately from $10^5$ to $10^8$ ohm-cm are even more preferred. Values greater than $10^9$ ohm-cm will lead to a significant voltage drop across the injection/buffer layer and therefore should be avoided.

The High Conductivity Third Layer (114)

The material for the third layer 114 should be chosen to match the energy level of the photoactive layer 102, or to improve hole injection/transport of the multilayer anode 104, or to improve the interfacial properties of the interface between the multilayer anode 104 and photoactive layer 102.

The third component of the hole-injecting electrode is a very thin layer of a highly conductive organic polymer having a resistance that is lower than the resistance of the material of the second layer 112 and higher than the first layer 110. A representative conductive organic polymer include pure PANI in its highly conductive forms, the polypyrroles and preferably polythiophenes such as PEDT, and any of the other organic materials described in the previous section for the second layer 112.

The material from which this layer (114) is formed should have a bulk conductivity with is from about five times to about $10^6$ times as great as the bulk conductivity of the second layer (112) is formed. Similarly the bulk resistivity should be from five to $10^6$ times lower. Where transparency of the multilayer anode 104 is desired and the layer comprises PEDT, this third layer is typically very thin, often so thin as to likely not be a completely continuous layer. The thickness should be in the range of from about 5 Å to about 500 Å with thicknesses in the range of 10 Å to 50 Å generally being preferred.

The addition of the high conductivity third layer (114) to second layer (112) yields a multilayer structure has a higher conductance than is observed with the second layer alone. The ratio of conductance of the bilayer (112 and 114) structure to the conductance of second layer 112 alone should range from about 1.25 to 20 with ratios of 1.5 to 15 and especially 2 to 10 being preferred.

The Cathode (106)

Suitable materials for use as cathode materials are any metal or nonmetal having a lower work function than the first electrical contact layer (in this case, an anode). Materials for the cathode layer 106 (in this case the second electrical contact) can be selected from alkali metals of Group 1 (e.g., Li, Cs), the Group 2 (alkaline earth) metals—commonly calcium, barium, strontium, the Group 12 metals, the rare earths—commonly ytterbium, the lanthanides, and the actinides. Materials such as aluminum, indium and copper, silver, combinations thereof and combinations with calcium and/or barium, Li, magnesium, LiF can be used. Alloys of low work function metals, such as for example alloys of magnesium in silver and alloys of lithium in aluminum, are also useful.

The thickness of the electron-injecting cathode layer ranges from less than 15 Å to as much as 5,000 Å. This cathode layer 106 can be patterned to give a pixellated array or it can be continuous and overlaid with a layer of bulk conductor such as silver, copper or preferably aluminum which is, itself, patterned.

The cathode layer may additionally include a second layer of a second metal added to give mechanical strength and durability.

The Substrate (108)

In most embodiments, the diodes are prepared on a substrate. Typically the substrate should be nonconducting. In those embodiments in which light passes through it, it is transparent. It can be a rigid material such as a rigid plastic including rigid acrylates, carbonates, and the like, rigid inorganic oxides such as glass, quartz, sapphire, and the like. It can also be a flexible transparent organic polymer such as polyester—for example poly(ethyleneterephthalate), flexible polycarbonate, poly (methyl methacrylate), poly(styrene) and the like.

The thickness of this substrate is not critical.

Contact Pads (80, 82)

Any contact pads 80, 82 useful to connect the electrode of the device 100 to the power source (not shown) can be used, including, for example, conductive metals such as gold (Au), silver (Ag), nickel (Ni), copper (Cu) or aluminum (Al).

Preferably, contact pads 80, 82 have a height (not shown) projected beyond the thickness of the high work function electrode lines 110 below the total thickness of layer.

Preferably, the dimensions of layers 102, 110, and 112 are such that contacts pads 80 are positioned on a section of the substrate 108 not covered by layers 102, 112 and 114. In addition, the dimensions of layer 106, 102, 110, and 112 are such that the entire length and width electrode lines 106 and electrode lines 110 have at least one layer 102, 112 intervening between the electrodes 106, 110, while electrical connection can be made between electrode 106 and contact pads 80.

Other Optional Layers

An optional layer including an electron injection/transport material may be provided between the photoactive layer 102 and the cathode 106. This optional layer can function both to facilitate electron injection/transport, and also serve as a buffer layer or confinement layer to prevent quenching reactions at layer interfaces. Preferably, this layer promotes electron mobility and reduces quenching reactions. Examples of electron transport materials for optional layer 140 include metal chelated oxinoid compounds, such as tris(8-hydroxyquinolato)aluminum ($Alq_3$); phenanthroline-based compounds, such as 2,9-dimethyl-4,7-diphenyl-1,10-phenanthroline (DDPA) or 4,7-diphenyl-1,10-phenanthroline (DPA), and azole compounds such as 2-(4-biphenylyl)-5-(4-t-butylphenyl)-1,3,4-oxadiazole (PBD) and 3-(4-biphenylyl)-4-phenyl-5-(4-t-butylphenyl)-1,2,4-triazole (TAZ), polymers containing DDPA, DPA, PBD, and TAZ moiety and polymer blends thereof, polymer blends containing containing DDPA, DPA, PBD, and TAZ.

Alternatively, some or all of anode layers 110, 112, 114, the photoactive layer 102, and cathode layer 106, may be surface treated to increase charge carrier transport efficiency. The choice of materials for each of the component layers is preferably determined by balancing the goals of providing a device with high device efficiency.

Fabrication Techniques

The various elements of the devices of the present invention may be fabricated by any of the techniques well known in the art, such as solution casting, screen printing, web coating, ink jet printing, sputtering, evaporation, precursor polymer processing, melt-processing, and the like, or any combination thereof.

In the most common approach, the diodes are built up by sequential deposit of layers upon a substrate. In a representative preparation, the conductive first layer 110 of the composite electrode 104 is laid down first. This layer is commonly deposited by vacuum sputtering (RF or Magnetron), electron beam evaporation, thermal vapor deposition, chemical deposition or the like methods commonly used to form inorganic layers.

Next, the low conductivity second layer 112 is laid down. This layer is usually most conveniently deposited as a layer from solution by spin casting or like technique. In those preferred cases where the layer is formed from water-soluble or water-dispersible material water is generally used as the spin-casting medium. In cases where a non-aqueous solvent is called for are used such as toluene, xylenes, styrene, aniline, decahydronaphthalene, chloroform, dichloromethane, chlorobenzenes and morpholine. This layer can be heat-treated as described in commonly filed U.S. provisional patent application No. 60/212,934.

Next, the higher conductivity layer 114 is deposited. Again, this is typically done from solution with the solvent selected as described with reference to the deposit of layer 112.

Next, the photoactive layer 102 of conjugated polymer is deposited. The conjugated polymer can be deposited or cast directly from solution. The solvent employed is one which will dissolve the polymer and not interfere with its subsequent deposition.

Typically, organic solvents are used. These can include halohydrocarbons such as methylene chloride, chloroform, and carbon tetrachloride, aromatic hydrocarbons such as xylene, benzene, toluene, other hydrocarbons such as decaline, and the like. Mixed solvents can be used, as well. Polar solvents such as water, acetone, acids and the like may be suitable. These are merely a representative exemplification and the solvent can be selected broadly from materials meeting the criteria set forth above.

When depositing various polymers on a substrate, the solution can be relatively dilute, such as from 0.1 to 20% w in concentration, especially 0.2 to 5% w. Film thicknesses of 500-4000 and especially 1000-2000 Å are typically used.

Finally the low work function electron-injecting contact is added. This contact is typically vacuum evaporated onto the top surface of the active polymer layer.

These steps can be altered and even reversed if an "upside down" diode is desired.

It will also be appreciated that the structures just described and their fabrication can be altered to include other layers for physical strength and protection, to alter the color of the light emission or sensitivity of the diodes or the like. It will further be appreciated that the present invention is further useful in organic electronic devices including the multilayer anode of the present invention do not contain a photoactive layer, such as transistors, capacitors, resistors, chemoresistive sensors (gas/vapor sensitive electronic noses, chemical and biosensors), writing sensors, and electrochromic devices (smart window).

The invention will be further described by the following Examples which are presented to illustrate the invention but not to limit its scope.

EXAMPLE 1

PANI(ES) was prepared according to the following reference (Y. Cao, et al, Polymer, 30 (1989) 2307). The emeraldine salt (ES) form was verified by the typical green color. HCl in this reference was replaced by poly(2-acrylamido-2-methyl-1-propanesulfonic acid (PAAMPSA) (Aldrich). First, 30.5 g (0.022 mole) of 15% PAAMPSA in water (Aldrich) was diluted to 2.3% by adding 170 ml water. While stirring, 2.2 g (0.022M) aniline was added into the PAAMPSA solution. Then, 2.01 g (0.0088M) of ammonium persulfate in 10 ml water was added slowly into the aniline/PAAMPSA solution under vigorous stirring. The reaction mixture was stirred for 24 hours at room temperature. To precipitate the product, PANI(ES), 1000 ml of acetone was added into reaction mixture. Most of acetone/water was decanted and then the PANI(ES)-precipitate was filtered. The resulting gum-like product was washed several times with acetone and dried at 40° C. under dynamic vacuum for 24 hours.

This Example demonstrates the direct synthesis of PANI(ES).

EXAMPLE 2

Four grams (4.0 g) of the PANI(ES) powder prepared in Example 1 was mixed with 400 g of deionized water in a plastic bottle. The mixture was rotated at room temperature for 48 hours. The solutions/dispersions were then filtered through 1 μm polypropylene filters. Different concentrations of PANI(ES) in water are routinely prepared by changing the quantity of PANI(ES) mixed into the water.

This Example demonstrates that PANI(ES) can be dissolved/dispersed in water and subsequently filtered through a 1 μm filter.

EXAMPLE 3

A poly(ethylenedioxythiophene), PEDT (Baytron P. special grade, commercially available from Bayer), solution was diluted with an equal amount deionized water. The solution was stirred at room temperature overnight. The PEDT content of the solution was 0.8%. PEDT solutions were also prepared in which the content of PEDT was 0.4, 0.2 and 0.16%, respectively. All these solutions can be filtered through a 0.23 1 μm filter.

EXAMPLE 4

Thirty grams (30 g.) of a PANI(ES)solution as prepared in Example 2 was mixed with 7 g of deionized water and 0.6 g of poly (acrylamide) (PAM)(M.W. 5,000,000-6,000,000, Polysciences) under stirring at room temperature for 4-5 days. The weight ratio of PANI(ES) to PAM in the blend solution is 1:2. Blend solutions were also prepared in which the weight ratio of PANI(ES) to PAM was 1:1, 1:1.5, 1:2.5, 1:3, 1:4, 1:5, 1:6 and 1:9, respectively.

EXAMPLE 5

Glass substrates were prepared with patterned ITO electrodes. Using the PANI, PEDT and PANI blend solutions as prepared in Examples 2, 3 and 4, layers were spin-cast on top of the patterned substrates and thereafter, baked at 90° C. in a vacuum oven for 0.5 hour. The films were then treated at 200° C. in a dry box for 30 minutes. The resistance between ITO electrodes was measured using a high resistance electrometer. Thickness of the film was measured by using a Dec-Tac surface profiler (Alpha-Step 500 Surface Profiler, Tencor Instruments). Table 1 compares the conductivity and thickness of PANI(ES),PANI(ES)-PAM blend and PEDT films. As can be seen from Table, the conductivity of PANI(ES) and PEDT is 10-4 and 10-3 S/cm respectively. Both values are too high for use in pixellated displays. The high temperature treated PANI(ES)-PAM blend has ideal conductivity and thickness for these materials to be used in pixellated displays.

This Example demonstrates that a high temperature-treated PANI(ES) blend has ideal conductivity and thickness for use in pixellated displays; i.e. sufficiently low that inter-pixel current leakage can be limited without need for patterning the PANI(ES) blend film.

TABLE 1

Bulk conductivity of PANI(ES), PANI(ES)-PAM blend and PEDT

| Blend | Baking Condition | Thickness (Å) | Conductivity (S/cm) |
|---|---|---|---|
| PANi | — | 426 | $5.1 \times 10^{-4}$ |
| PEDT | — | 1221 | $1.8 \times 10^{-3}$ |
| PANi-PAM (1:2) | 200° C./30 min | 2195 | $7.4 \times 10^{-7}$ |

EXAMPLE 6

Light emitting diodes were fabricated using soluble poly (1,4-phenylenevinylene) copolymer (C-PPV) (H. Becker, H. Spreitzer, W. Kreduer, E. Kluge, H. Schenk, I.D. Parker and Y. Cao, Adv. Mater. 12, 42 (2000) as the active semiconducting, luminescent polymer; the thickness of the C-PPV films were 700-900 Å. C-PPV emits yellow-green light with emission peak at ~560 nm. Indium/tin oxide was used as the anode contact layer. A layer of PANI, PEDT or PANI-PAM blend was then applied using the solutions prepared in Examples 2, 3 and 4. These layers were spin-cast on top of the patterned substrates. The layers were baked at 90° C. in a vacuum oven for 30 minutes, then treated at 200° C. in dry box for 30 minutes. The active layer and a metal cathode were applied. The device architecture was ITO/Polyaniline blend/C-PPV/metal. Devices were fabricated using both ITO on glass (Applied ITO/glass) and ITO on plastic, polyethylene teraphthalate, PET, as the substrate (Courtauld's ITO/PET); in both cases, ITO/Polyaniline blend bilayer was the anode and the hole-injecting contact. Devices were made with a layer of either Ca or Ba as the cathode. The metal cathode film was fabricated on top of the C-PPV layer using vacuum vapor deposition at pressures below $1 \times 10^{-6}$ Torr yielding an active layer with area of 3 cm$^2$. The deposition was monitored with a STM-100 thickness/rate meter (Sycon Instruments, Inc.). 2,000-5,000 Å of aluminum was deposited on top of the 15 Å barium layer. For each of the devices, the current vs. voltage curve, the light vs. voltage curve, and the quantum efficiency were measured. The measured operating voltage and efficiencies of the devices with different blend layer are summarized in the Table 2. As can be seen from the data, the lowest operating voltage and highest light output were achieved from the device with the PEDT layer.

This Example demonstrates that highest performance polymer LEDs can be fabricated using PEDT as a hole injection (buffer) layer.

TABLE 2

Performance of devices fabricated with PANI(ES), PANI(ES)-PAM blend and PEDT

| | | Device Performance at 8.3 mA/cm$^2$ | | |
|---|---|---|---|---|
| Blend | Baking Condition | V | cd/A | Lm/W |
| PANi | — | 4.7 | 7.4 | 4.9 |
| PEDT | — | 4.5 | 7.7 | 5.2 |
| PANi-PAM (1:2) | 200° C./30 min | 6.6 | 7.2 | 3.6 |

EXAMPLE 7

Figure 3:
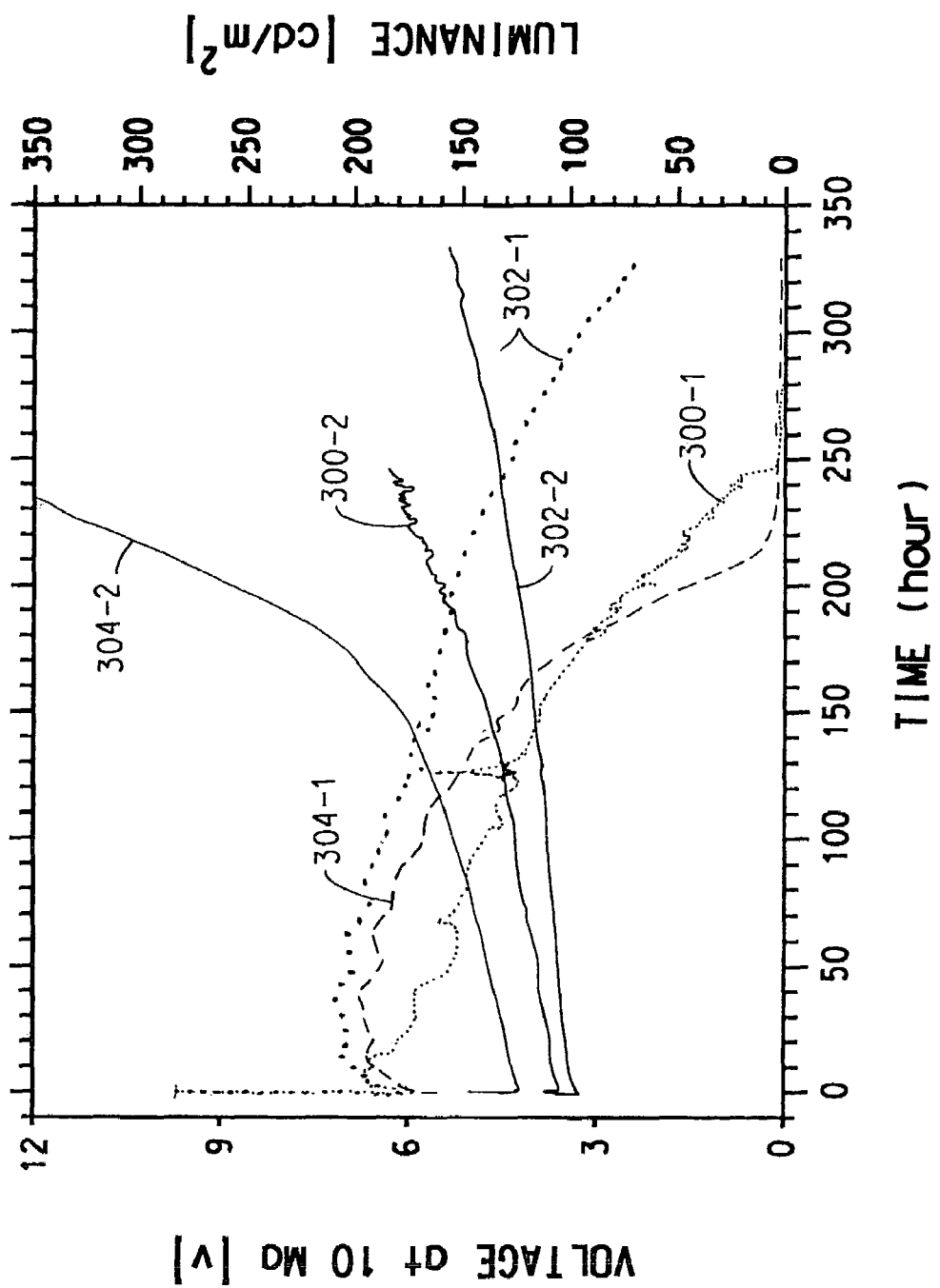
FIG. 3 is a graph which shows the stress-induced degradation of three devices, one with a polyaniline (emeraldine-salt) layer (PANI(ES)), one with a layer made with a blend of polyaniline with polyacrylamide (PANI(ES)-PAM) and one with a layer of poly(ethylenedioxythiophene) (PEDT) layer at 70° C. Solid lines represent operating voltage and dashed lines represent light output.

Devices produced in accord with Example 6 were encapsulated using a cover glass sandwiched by UV curable epoxy. The encapsulated devices were run at a constant current of 3.3 ma/cm$^2$ in an oven at a temperature of 70° C. The total current through the devices was 10 mA with luminance of approx. 200 cd/cm$^2$. Table 3 and FIG. 3 shows the light output and voltage increase during operation at 70° C. The light output 300-1, 302-1, 304-1 for devices 300, 302 and 304 respectively are shown in dashed lines in FIG. 3. The voltage output 300-2, 302-2, 304-2 for devices 300, 302 and 304 respectively are shown in solid lines in FIG. 3.

In contrast to devices with PANI(ES) and PANI(ES)-PAM blend as anode, which degrade within 160-190 hours of stress at 70° C., the half life of the devices with the PEDT layer reaches 300 hours with a very low voltage increase (4.3 mV/hour). It is almost twice longer than the device with PANI(ES)-PAM blend. However, PEDT layers alone do not have resistance sufficiently high to avoid inter-pixel current leakage and is not suitable for use in pixellated displays. From Ahrennius plots of the luminance decay and voltage increase data collected at 50, 70 and 85° C., the temperature acceleration factor was estimated to be ca. 25 at 70° C. Thus, the extrapolated stress life at room temperature was determined to be approximately 7,500 hours for devices with the PEDT layer.

This Example demonstrates that longest lifetimes can be obtained for polymer LEDS fabricated with PEDT layers. However, these layers do not have resistance sufficiently high to avoid inter-pixel current leakage.

TABLE 3

Stress life of LED devices fabricated with PANI(ES), PANI(ES)-PAM blend and PEDT

| FIG. 3 | | | Stress Life at 70° C. at 3.3 mA/cm$^2$ | | |
|---|---|---|---|---|---|
| Ref. No. | Blend | Baking Condition | mV/h | cd/m$^2$* | $t_{1/2}$(h) |
| 300 | PANi | — | 7.4 | 185 | 186 |
| 302 | PEDT | — | 4.3 | 185 | 300 |
| 304 | PANi-PAM (1:2) | 200° C./30 min | 11.3 | 171 | 168 |

*Initial Brightness

EXAMPLE 8

The resistance measurements of Example 5 were repeated, but the PANI(ES) layer was spin-cast from the blend solutions prepared in Examples 4 at 1400 rpm. The weight ratio of PANI(ES) to PAM in the blend solution is 1:2. The film was baked at 200° C. for 30 minutes in dry box after dried in 90° C. vacuum oven for 0.5 hour. The thin PEDT film was spinning cast on the top of the PANI blend layer from the solution prepared in Example 3. The thickness of the PEDT layer is ranged from 970 Å to ~10 Å. The resistance between ITO electrodes was measured using a high resistance electrometer. Thickness of the film was measured by using a Dec-Tac surface profiler (Alpha-Step 500 Surface Profiler, Tencor Instruments). Table 4 shows the surface resistance of PANI(ES)-blend/PEDT double layer films with different PEDT thickness. As can be seen from Table, the surface resistance of the PANI(ES)-blend/PEDT double layer can be controlled over a wide range, from 10$^7$ to 10$^9$ ohm/sq by adjusting the thickness of PEDT layer. While the thickness of PEDT decrease to below 50 Å, the conductivity of the double layer is below $10^8$ ohm/sq, which is ideal for use in pixellated displays.

This Example demonstrates that PANI(ES)-blend/PEDT double layer films can be prepared with conductivity less than $10^8$ ohm/sq.

TABLE 4

Surface Resistance of PANI(ES)-PAM/PEDT double layer with different PEDT thickness

| PEDT Solution Concentration (%) | Spinning Rate (rpm) | PEDT Thickness (Å) | Double Layer Thickness (Å) | Surface Resistance (ohm/sq) |
|---|---|---|---|---|
| 1.6 | 800 | 970 | 2768 | $5.8 \times 10^7$ |
| 0.8 | 3000 | 192 | 1788 | $4.0 \times 10^8$ |
| 0.8 | 6000 | 90 | 1962 | $5.8 \times 10^8$ |
| 0.4 | 6000 | ~50 | 2694 | $1.4 \times 10^9$ |
| 0.2 | 3000 | ~40 | 2025 | $5.3 \times 10^9$ |
| 0.2 | 6000 | ~20 | 1640 | $6.1 \times 10^9$ |
| 0.16 | 4000 | ~10 | 2045 | $5.8 \times 10^9$ |

EXAMPLE 9

The device measurements summarized in Example 6 were repeated, but the PANI blend layer was replaced with PANI(ES)-blend/PEDT double layers prepared as in Examples 8. Table 5 shows the device performance of LEDs fabricated from polyblend films with various double layers. Devices fabricated with PANI blend/PEDT double layers exhibit the same operating voltage and light efficiency as devices made with PEDT layers.

This Example demonstrates that a PANI blend/PEDT double layer can be used to fabricate polymer LEDs with the same low operating voltage and high efficiency as devices made with a PEDT layer.

TABLE 5

Performance of devices fabricated with PANI(ES)-PAM/PEDT double layer with different PEDT thickness

| PEDT Solution Concentration (%) | Spinning Rate (rpm) | PEDT Thickness (Å) | Device Performance at 8.3 mA/cm² | | |
|---|---|---|---|---|---|
| | | | V | cd/A | Lm/W |
| 1.6 | 800 | 970 | 5.3 | 6.9 | 4.1 |
| 0.8 | 3000 | 192 | 4.3 | 7.2 | 5.2 |
| 0.8 | 6000 | 90 | 4.2 | 7.6 | 5.6 |
| 0.4 | 6000 | ~50 | 4.2 | 7.6 | 8.2 |
| 0.2 | 3000 | ~40 | 4.9 | 8.0 | 5.1 |
| 0.2 | 6000 | ~20 | 4.7 | 8.3 | 5.5 |
| 0.16 | 4000 | ~10 | 5.0 | 8.1 | 5.1 |

EXAMPLE 10

Figure 4:
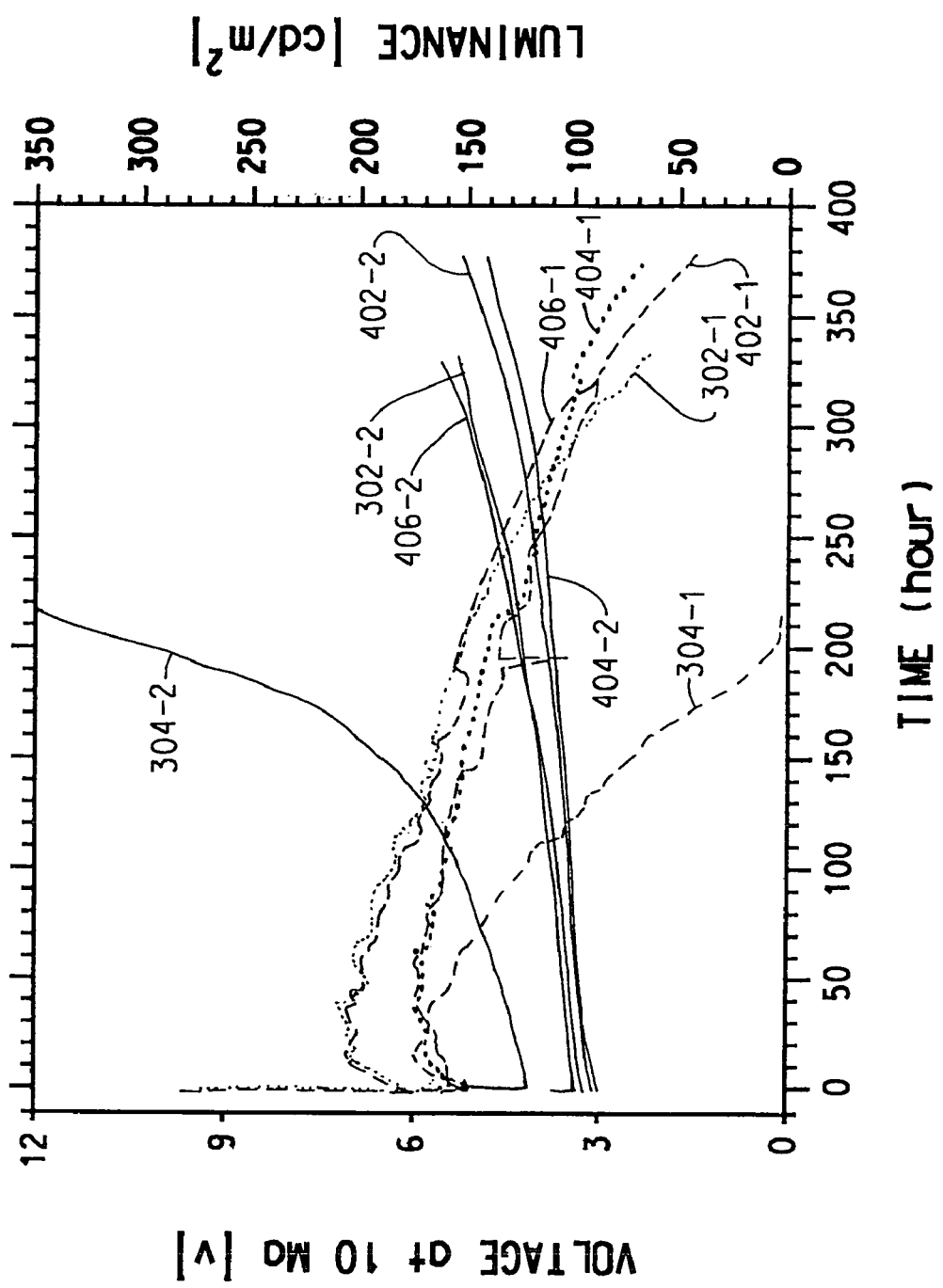
FIG. 4 is a graph which shows the stress-induced degradation of devices having a PANI(ES)-PAM/PEDT double layer with different PEDT thickness at 70° C. Solid lines represent operating voltage and dashed lines represent light output.

The stress measurements summarized in Example 7 were repeated, but the PANI blend layer (incorporated in device 300 in Table 3) was replaced by PANI blend/PEDT double layers prepared as in Examples 8. Table 6 and FIG. 4 show the stress life of devices fabricated with a PANI blend/PEDT double layer. In FIG. 4, the light output 302-1, 304-1, 402-1, 404-1, and 406-1 for devices 302 and 304 as shown in Table 3 and devices 402, 404 and 460 as shown in Table 6, respectively, are shown in dashed lines. The voltage output 302-2, 304-2, 402-2, 404-2, and 406-2 for devices 302 and 304 as shown in Table 3 and devices 402, 404 and 460 as shown in Table 6, respectively, are shown in solid lines.

As can be seen from the data, the voltage increase rate of the double layer device with an ~10 Å to 20 Å layer of PEDT is slightly lower than that of device made from PEDT. The half-life time of the double layer device is even slightly longer than that of the PEDT device.

This Example demonstrates that the PANI blend/PEDT double layer can combine the high resistance of PANI blend and long life stress lifetime of PEDT in one device.

TABLE 6

Stress life of LED devices fabricated with PANI(ES)-PAM/PEDT double layer with different PEDT thickness

| FIG. 4 Ref. No. | PEDT Solution Concentration (%) | Spinning Rate (rpm) | PEDT Thickness (Å) | Stress Life at 70° C. at 8.3 mA/cm² | | |
|---|---|---|---|---|---|---|
| | | | | MV/h | cd/m²* | $t_{1/2}$(h) |
| | 1.6 | 800 | 970 | 9.2 | 194 | 221 |
| | 0.8 | 3000 | 192 | 5.8 | 144 | 300 |
| 402 | 0.8 | 6000 | 90 | 3.8 | 189 | 319 |
| 404 | 0.4 | 6000 | ~50 | 3.4 | 171 | 350 |
| | 0.2 | 3000 | ~40 | 4.7 | 189 | 303 |
| 406 | 0.2 | 6000 | ~20 | 4.2 | 190 | 328 |
| | 0.16 | 4000 | ~10 | 3.8 | 190 | 330 |

*Initial Brightness

EXAMPLE 11

The resistance measurements of Example 5 were repeated, but the PANI(ES) layer was spin-cast from the blend solutions prepared in Examples 4. The weight-ratio of PANI(ES) to PAM in the blend solution is 1:1.5, 1:2, 1:3, 1:4 1:5 and 1:6. The film was baked at, 200° C. for 30 minutes in dry box after dried in 90° C. vacuum oven for 0.5 hour. The thin PEDT film was spinning cast on the top of the PANI blend layers from the solution prepared in Example 3. The concentration of PEDT solution is 0.16% and the spinning rate is 4000 rpm. The thickness of the PEDT layer is ~10 Å. The resistance between ITO electrodes was measured using a high resistance electrometer. Thickness of the film was measured by using a Dec-Tac surface profiler (Alpha-Step 500 Surface Profiler, Tencor Instruments). Table 7 shows the surface resistance of PANI blend/PEDT double layer films with different PANI(ES) to PAM ratio. As can be seen from the Table, the surface resistance of the PANI blend/PEDT double layer can be controlled over a wide range, from $10^8$ to $10^{15}$ ohm/sq by adjusting the weight ratio of PANI(ES)-PAM layer.

This Example demonstrates that PANI blend/PEDT double layer films can be prepared with conductivity less than $10^8$ ohm/sq and even less than $10^{13}$ ohm/sq.

TABLE 7

Surface Resistance of PANI(ES)-PAM/PEDT double layer with different PANI(ES)-PAM blend

| PANI Blend | Composition (w:w) | Double Layer Thickness (Å) | Surface Resistance (ohm/sq) |
|---|---|---|---|
| PANI-PAM | 1:1.5 | 1822 | $6.6 \times 10^8$ |
| PANI-PAM | 1:2 | 2078 | $5.7 \times 10^9$ |
| PANI-PAM | 1:3 | 2252 | $2.1 \times 10^{13}$ |
| PANI-PAM | 1:4 | 1621 | $1.1 \times 10^{15}$ |
| PANI-PAM | 1:5 | 1734 | $9.0 \times 10^{14}$ |
| PANI-PAM | 1:6 | 2422 | $9.6 \times 10^{14}$ |

EXAMPLE 12

The device measurements summarized in Example 6 were repeated, but the PANI blend layer was replaced with PANI blend/PEDT double layers. Table 8 shows the device performance of LEDs fabricated from polyblend films with different double layers. When the PANI to PAM ratio was larger than 1:4, devices fabricated with PANI blend/PEDT double layer exhibited the same operating voltage and light efficiency as devices made with a PEDT layer alone. The lower PANI(ES) to PAM ratios result in deterioration of device performance.

This Example demonstrates that PANI blend/PEDT double layers can be used to fabricate polymer LEDs with the same low operating voltage and high efficiency as devices made with a PEDT layer alone.

TABLE 8

Performance of devices fabricated with PANI(ES)-PAM/PEDT double layer with different PANI(ES)-PAM blends

| PANI Blend | Composition (w:w) | Double Layer Thickness (Å) | Device Performance at 8.3 mA/cm² | | |
|---|---|---|---|---|---|
| | | | V | cd/A | Lm/W |
| PANI-PAM | 1:1.5 | 1822 | 6.0 | 6.4 | 3.4 |
| PANI-PAM | 1:2 | 2078 | 5.0 | 8.1 | 5.1 |
| PANI-PAM | 1:3 | 2252 | 5.8 | 7.9 | 4.3 |
| PANI-PAM | 1:4 | 1621 | 5.8 | 8.8 | 4.6 |
| PANI-PAM | 1:5 | 2422 | 8.0 | 8.7 | 3.1 |
| PANI-PAM | 1:6 | 2078 | 8.3 | 8.2 | 3.0 |

EXAMPLE 13

Figure 5:
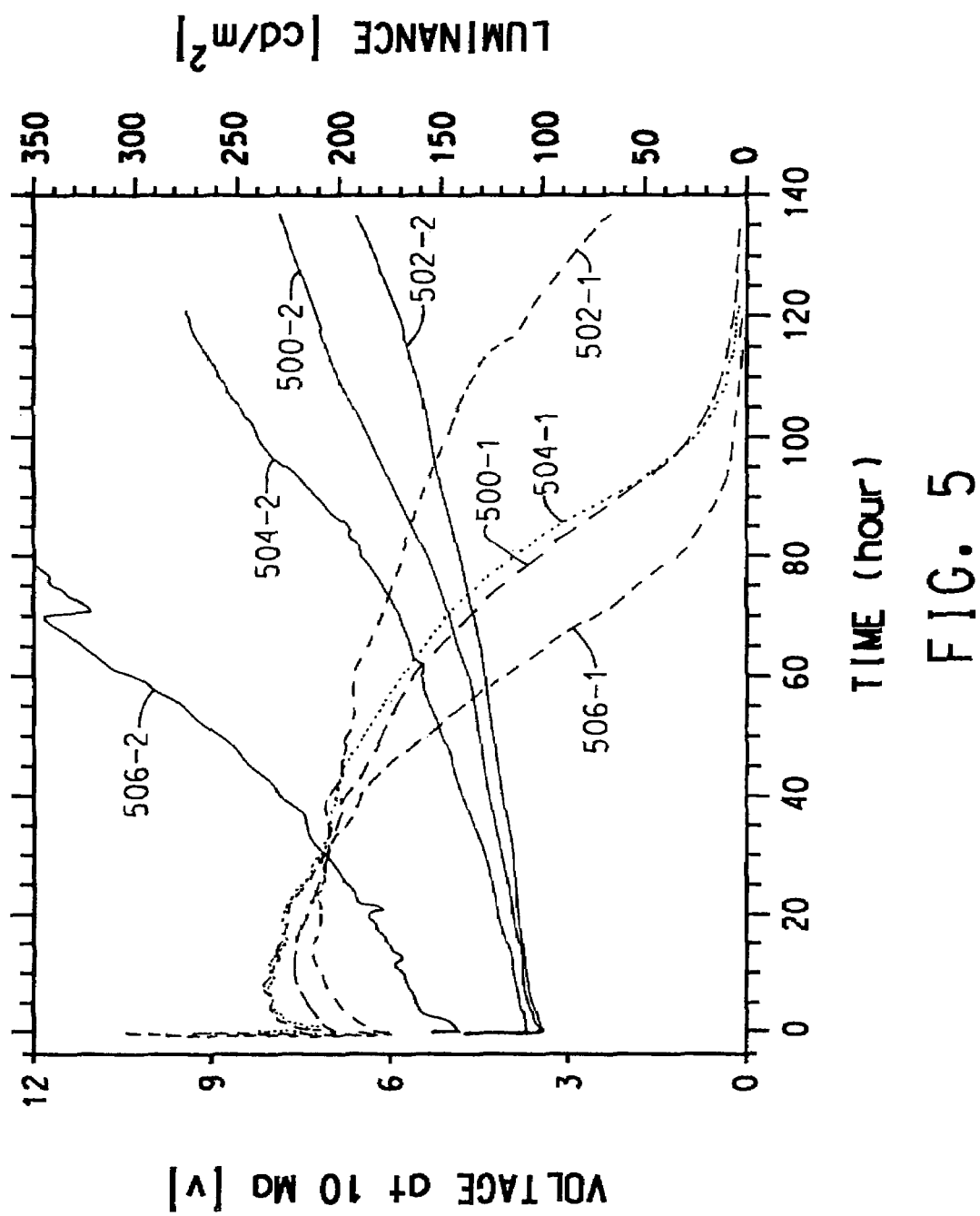
FIG. 5 is a graph which shows the stress-induced degradation of a series of devices having PANI(ES)-PAM/PEDT double layers with different PANI(ES)-PAM blends at 80° C. Solid lines represent operating voltage and dashed lines represent light output.

The stress measurements summarized in Example 7 were repeated, but the PANI(ES)-blend layer was replaced with PANI blend/PEDT double layers. Table 9 and FIG. 5 show the stress life of devices fabricated with the PANI(ES) blend/PEDT double layers at 80° C. The luminance 500-1, 502-1, 504-1, and 506-1 for devices 500, 502, 504 and 506 respectively are shown in dashed lines in FIG. 3. The voltage output 500-2, 502-2, 504-2, and 506-2 for devices 500, 502, 504 and 506 respectively are shown in solid lines in FIG. 5. When the PANI to PAM ratio is larger than 1:4, the voltage increase rate of the double layer device was lower than that of devices made from PEDT. The half-life time of the double layer device is even longer than that of the PEDT device at 80° C.

This Example demonstrates that the PANI(ES) blend/PEDT double layer can combine the high resistance of PANI blend and the long life stress life time of PEDT in one device.

TABLE 9

Stress life of LED devices fabricated with PANI(ES)-PAM/PEDT double layers with different PANI(ES)-PAM blend

| Ref. No. In FIG. 5 | PANI Blend | Composition (w:w) | Double Layer Thickness (Å) | Stress Life at 70° C. at 3.3 ma/cm²: | | |
|---|---|---|---|---|---|---|
| | | | | mV/h | cd/m²* | $t_{1/2}$(h) |
| 500 | PEDT | — | — | 19.6 | 217 | 80 |
| | PANI-PAM | 1:1.5 | 1822 | 19.8 | 198 | 108 |
| 502 | PANI-PAM | 1:2 | 2078 | 15.7 | 210 | 123 |
| | PANI-PAM | 1:3 | 2252 | 17.9 | 180 | 89 |
| 504 | PANI-PAM | 1:4 | 1621 | 19.5 | 229 | 81 |
| 506 | PANI-PAM | 1:5 | 2422 | 67.2 | 232 | 61 |
| | PANI-PAM | 1:6 | 2087 | 124.8 | 210 | 53 |

*Initial Brightness

What is claimed is:

1. An array of polymer emissive diodes comprising an active emissive polymer layer having a first side in contact with a patterned cathode and a second side in contact with a patterned transparent anode, the patterning of said anode and cathode defining an array of emissive diodes, wherein a multilayer anode including a first layer comprising a patterned high conductivity inorganic contact layer, a nonpatterned second layer in physical contact with said first layer, said second layer comprising conjugated conductive organic polymer and having a high resistance and a nonpatterned transparent third layer in physical contact with said second layer and with said active emissive polymer layer, said third layer comprising a conductive organic polymer and having a lower resistance than said second layer.

2. The array of claim 1 wherein said second layer comprises a blend of conjugated conductive organic polymer with nonconductive polymer.

3. The array of claim 2 wherein said blend is a dispersion of one polymer in the other.

4. The array of claim 2 wherein said blend is a solution of one polymer in the other.

5. The array of claim 4 wherein said second layer comprises a mixture of conjugated conductive organic polymer with a nonconductive host polymer.

6. The array of claim 1 wherein the second layer comprises a blend of PANI with nonconductive polymer.

7. The array of claim 6 wherein the second layer has a bulk conductivity of from $10^{-4}$ S/cm to $10^{11}$ S/cm and wherein the bulk conductivity of the third layer is from about 5 times to about $10^6$ times as great as the conductivity of the second layer.

8. The array of claim 7 wherein the second layer has a thickness of from about 500 Å to about 5000 Å.

9. The array of claim 7 wherein the third layer has a thickness of from about 2 Å to about 400 Å.

10. The array of claim 1 wherein said patterned high conductivity transparent inorganic contact layer is present on a support.

* * * * *